(12) United States Patent
Deas et al.

(10) Patent No.: US 6,642,764 B2
(45) Date of Patent: Nov. 4, 2003

(54) HIGH PRECISION RECEIVER WITH SKEW COMPENSATION

(75) Inventors: Alexander Roger Deas, Edinburgh (GB); Vasily Grigorievich Atyunin, Saint Petersburg (RU); Igor Anatolievich Abrosimov, St.Petersburg (RU)

(73) Assignee: Acuid Corporation (Guernsey) Limited, Guernsey (VG)

( * ) Notice: Subject to any disclaimer, the term of this patent is extended or adjusted under 35 U.S.C. 154(b) by 0 days.

(21) Appl. No.: 10/012,779

(22) Filed: Dec. 10, 2001

(65) Prior Publication Data

US 2002/0070774 A1 Jun. 13, 2002

Related U.S. Application Data

(60) Provisional application No. 60/251,983, filed on Dec. 11, 2000.

(51) Int. Cl.$^7$ ................................................. H03K 3/12
(52) U.S. Cl. ........................................ 327/205; 327/206
(58) Field of Search ................................. 327/205, 206

(56) References Cited

U.S. PATENT DOCUMENTS

| 5,404,054 | A | | 4/1995 | Kotowski |
| 5,610,545 | A | | 3/1997 | Jenkins et al. |
| 5,617,050 | A | | 4/1997 | Jenkins et al. ............... 327/205 |
| 5,798,663 | A | | 8/1998 | Fugere et al. |
| 6,163,190 | A | * | 12/2000 | Takai et al. .................. 327/205 |
| 6,249,162 | B1 | * | 6/2001 | Inoue .......................... 327/205 |
| 6,304,088 | B1 | | 10/2001 | Yee ............................. 324/433 |
| 6,359,485 | B1 | * | 3/2002 | Drapkin et al. ............. 327/205 |

FOREIGN PATENT DOCUMENTS

FR  2 687 870  8/1993

* cited by examiner

Primary Examiner—Kenneth B. Wells
(74) Attorney, Agent, or Firm—Darby & Darby

(57) ABSTRACT

A high precision receiver with a means to reduce or compensate the skew caused by the receiver's hysteresis by using a dynamic reference that is varied depending on a current output signal. To avoid oscillation, the reference signal can be switched over with a certain delay.

4 Claims, 2 Drawing Sheets

HIGH PRECISION RECEIVER WITH SKEW COMPENSATION

This patent application claims the benefit of priority under 35 U.S.C. §119 of U.S. Provisional Application Serial No. 60/251,983, filed Dec. 11, 2000, entitled "High Precision Receiver With Skew Compensation," the entirety of which is being hereby incorporated by reference.

BACKGROUND OF THE INVENTION

1. Field of the Invention

This invention relates generally to digital signal processing, and more particularly, to a receiver having an input means for receiving an input signal and a reference signal, and an output means for producing an output digital signal varying from a high level to a low level depending on whether a threshold is crossed by the input signal. Further, this invention relates to a method for compensating the skew of a receiver of the above type.

2. Background of the Invention

In many electronic applications, receivers are used to generate an output digital signal varying from a high level to a low level depending on whether a threshold is crossed by the input signal. Commonly this function is implemented in a comparator comparing an input signal with a threshold signal and outputting a high level or low level signal depending on whether a threshold is crossed by the input signal.

Input signals often include noise (due to external noise sources, temperature variations, etc.). Because of such noise, a "false" threshold crossing may occur causing a receiver to erroneously output an incorrect logic level. In order to increase a receiver's immunity to noise, a hysteretic comparator can be used which has two actual threshold values differing from one another by a hysteresis value. When the input signal is above a first actual threshold the output signal is high-level, and when the input signal is below a second actual threshold the output signal is low-level. Thus, a hysteresis value is the difference between these two actual threshold values.

Therefore, if the input signal is measured in, e.g. volts, the hysteresis value can also be expressed in volts.

As well known to those skilled in the art, a traditional hysteretic comparator will always produce a skew (described below in more detail) that may be insignificant in low-speed applications. However, in the up-to-date high-speed communication systems the skew produced by traditional hysteretic comparators can adversely affect the outputted data.

This problem was not solved using means known in the art.

U.S. Pat. No. 5,404,054 to Kotowski describes a method and apparatus for controlling programmable or dynamic hysteresis. In Kotowski's method and circuit, the hysteresis "decay pattern," the rate of decay, and the minimum separation between a high switchpoint and a low switchpoint are all programmable. Kotowski's circuit uses one or more comparators and digital-to-analog converters (DAC) controlled by digital logic, depending on the number of switchpoints.

U.S. Pat. Nos. 5,610,545 and 5,617,050 to Jenkins et al. respectively describe a method and a circuit for providing programmable hysteresis levels, using a programmable hysteresis input for adjusting the hysteresis differential to different preset and intermediate hysteresis levels.

U.S. Pat. No. 5,798,663 describes a hysteresis generator for providing a comparator with precision hysteresis reference input by varying threshold reference voltage of a comparator depending upon whether the output state of the comparator is high or low.

The related art discloses various means for hardware hysteresis control or programmable dynamic hysteresis for threshold detection. However, none of the related art provides simple means to compensate the skew caused by a comparator hysteresis and provide accurate detection of High and Low output signal states.

BRIEF SUMMARY OF THE INVENTION

The object of the present invention is the provision of a signal receiver with a hysteretic comparator incorporated therein, with simple means to compensate the skew caused by the hysteresis.

Another object of the present invention is to provide a method for compensating the skew of a receiver of the above type.

In one aspect of the invention, claimed is a receiver having an input means for receving an input signal and a reference signal, and an output means for producing an output digital signal varying from a high level to a low level depending on whether a threshold, that is a function of the reference signal, is crossed by the input signal, the receiver comprising a hysteretic comparator having a first input and a second input, and an output making up the receiver output means and providing said output signal; wherein the output signal is high-level when the input signal is above a first threshold, and is low-level when the input signal is below a second threshold, the first threshold and the second threshold differing from one another by a hysteresis value, and a reference signal adjusting means having a signal input, a control input to which said output signal is fed via a feedback line, and an output for providing the threshold signal, wherein the reference signal adjusting means increases the reference signal when the output signal is high-level, and decreases the reference signal when the output signal is low-level; and wherein said first comparator input and said adjusting means signal input make up said receiver input means, so that said input signal is fed to the first comparator input; said reference signal is fed to the adjusting means signal input; and said adjusting means output is connected to the comparator second input.

Preferably, the the threshold-adjusting means further comprise an offset signal generator for producing an offset signal of substantially half the hysteresis value; an adder/subtractor having an input that makes up said adjusting means signal input and another input for receiving said offset signal, and an output providing a sum and difference of the reference signal and offset signal; and a multiplexor having an input receiving said sum and difference, a control input that makes up said adjusting means control input and an output that makes up said adjusting means output.

Preferably, said feedback line has a delay means incorporated therein.

In another aspect of the invention, claimed is a method for compensating the skew of a receiver adapted for receiving an input signal and a reference signal, the receiver comprising a hysteretic comparator, the method including feeding said input signal and reference signal to respective inputs of the hysteretic comparator, increasing the reference signal when the output signal is high, and decreasing the reference signal when the output signal is low.

Preferably, the steps of increasing and decreasing the reference signal are delayed. Preferably, the reference signal is increased and decreased by substantially one half the hysteresis value of said hysteretic comparator. The hysteresis value may be precalculated basing on the comparator specification, measured or monitored.

Preferably, the delay is about half the period of the input signal (for a periodic data transmission). For non-periodic signals, the delay depends upon a signal slew rate.

BRIEF DESCRIPTION OF THE SEVERAL VIEWS OF THE DRAWINGS

For a better understanding of the present invention and the advantages thereof and to show how the same may be carried into effect, reference will now be made, by way of example, to the following description now taken in conjunction with the accompanying drawings in which.

DETAILED DESCRIPTION OF THE INVENTION

Figure 1:
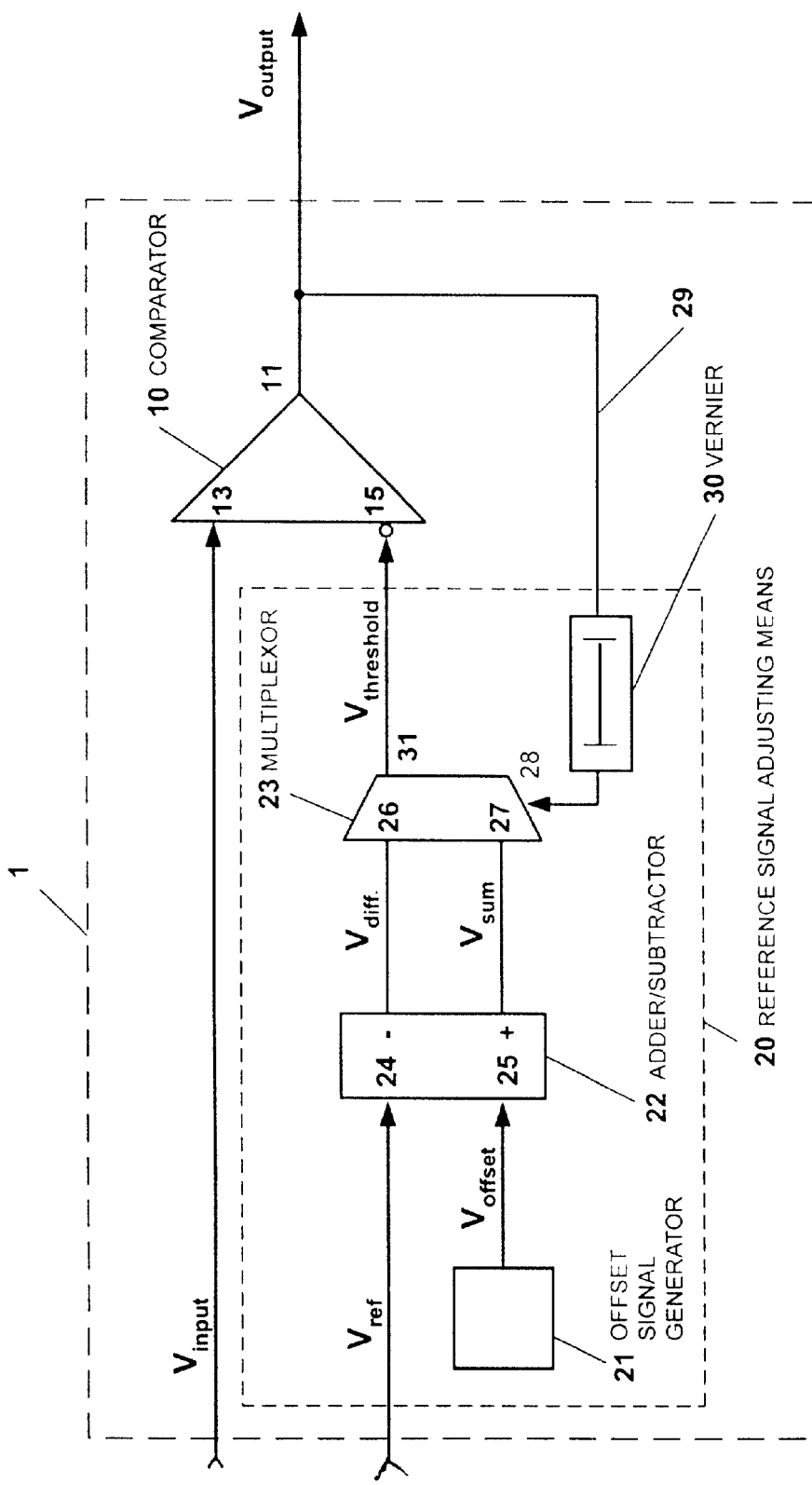
FIG. 1 is a circuit diagram of a high precision receiver with a means to compensate hysteresis in accordance with the present invention.

An example embodiment of the present invention is described with reference to FIG. 1. Presented in FIG. 1 is a receiver 1 having an input means for receiving an input signal $V_{input}$ and a reference signal $V_{ref}$, and an output means for producing an output digital signal $V_{output}$ varying from a high voltage level to a low voltage level depending on whether a threshold is crossed by the input signal $V_{input}$. It shall be noted that the notation such as $V_{input}$, $V_{ref}$, $V_{output}$ and the like here define a signal and/or its voltage. The receiver comprises a hysteretic comparator 10 and a reference signal adjusting means 20. The comparator 10 has a first input 13 and a second input 15. An input signal is fed to the first comparator input 13; thus, the input 13 makes up the receiver input means. The second comparator input 15 receives a threshold signal from the signal adjusting means described below in more detail. The output 11 of the comparator 10 makes up the receiver output means and provides said output signal $V_{output}$.

The design of a hysteretic comparator is well-known to those skilled in the art, and thus not specified in detail here (see, e.g. The Art of Electronics, second edition by Paul Horowitz and Winfield Hill, Cambridge University Press, 1980, 1989, ISBN 0521-37095-7, pages 229 to 231). It is well known, however, that the output signal voltage $V_{output}$ of a hysteretic comparator is high when the input signal is above a first threshold, and is low when the input signal is below a second threshold. It shall be noted that the first threshold and the second threshold are functions of the reference signal $V_{ref}$. These two thresholds differ from one another by a hysteresis voltage.

The receiver further comprises a reference signal adjusting means 20 including an offset signal generator 21, an adder/subtractor 22 and a multiplexor 23.

The adder/subtractor 22 has an input 24 for said reference signal. This input makes up the adjusting means signal input. Further, the adder/subtractor 22 has an input 25 for an offset signal generated by the offset signal generator. An offset signal $V_{offset}$ is a constant-voltage signal of substantially half the hysteresis voltage. The design of a generator for producing this kind of signal is well-known to those skilled in the art, and thus not specified in detail here. At the output, the adder/subtractor 22 provides a difference and sum of the reference signal and offset signal. The design of an adder/subtractor for producing a sum and difference of two inputted signals is well known to those skilled in the art, and thus not specified in detail here. Both the difference and sum of the reference signal and offset signal are received at respective inputs 26 and 27 of the multiplexor 23. The multiplexor 23 has a control input 28. To the control input 28, said output signal $V_{output}$ is fed via a feedback line 29 from the output 11. A delay means e.g. a vernier 30 is incorporated in the feedback line. The vernier 30 is set in such a way that $V_{offset}$ is added to or subtracted from, the reference signal with a delay about half the period of the input signal. The design of a multiplexor for switching between two inputted signals by control of a control signal is well known to those skilled in the art, and thus not specified in detail here.

At the multiplexor 23 output 31 that makes up said adjusting means output a threshold signal is produced. The multiplexor 23 output 31 is connected to the comparator second input 15. Thus, the threshold signal $V_{threshold}$ is fed to the comparator 10.

The voltage $V_{threshold}$ is not constant but depends on whether $V_{output}$ is at a high level or a low level. In particular, when $V_{output}$ is high, the reference signal adjusting means 20 produces $V_{threshold}$ as a sum of $V_{ref}$ and $V_{offset}$. Similarly, when $V_{output}$ is low, $V_{ref}$ is decreased by $V_{offset}$ that is half the hysteresis voltage. $V_{offset}$ is added to or subtracted from, the reference signal with a delay of about the half period of the input signal.

The operation of the receiver 10 is illustrated in FIGS. 2a–2d.

According to the invention, to compensate the skew caused by the comparator hysteresis, a dynamic threshold is used, whereby when a high voltage or logical "one" is currently outputted, the threshold is shifted up by half the hysteresis value, and when a low voltage or logical "zero" is outputted, the reference is respectively shifted down. This will reduce or totally eliminate the skew caused by the comparator hysteresis.

Figure 2A:
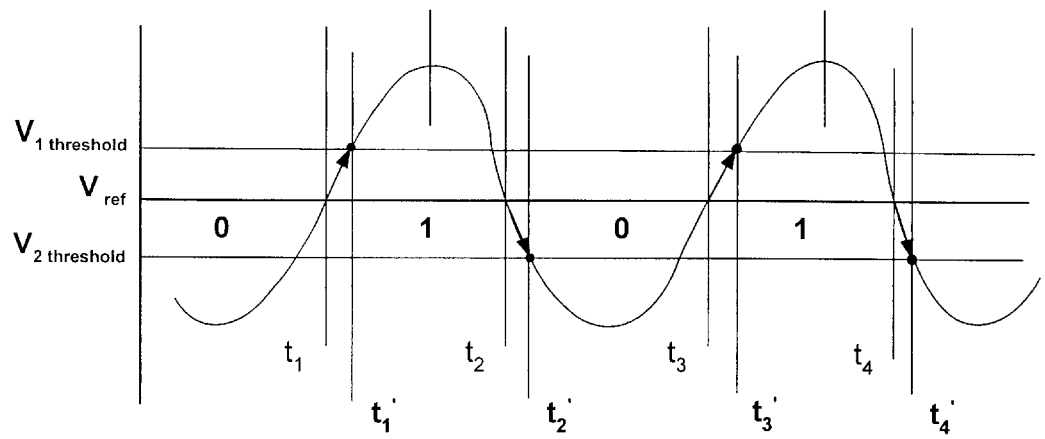
FIGS. 2a–2d show voltage levels illustrating the operation of the receiver in accordance with the preferred embodiment of the present invention.
Figure 2B:
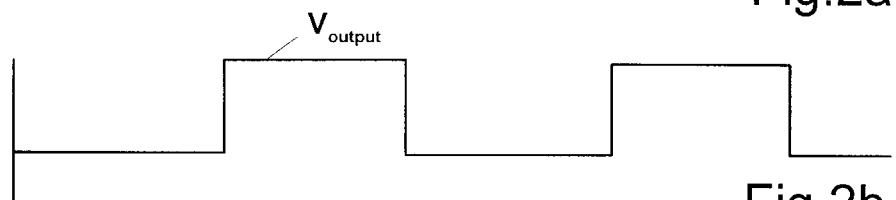

As illustrated in FIG. 2a, when a comparator does not have a hysteresis, a typical input signal will cross a constant threshold when the voltage of this signal reaches $V_{ref}$, i.e., at moments $t_1$, $t_2$, $t_3$ and $t_4$. However, with a hysteretic comparator, the threshold will be crossed later, when the voltage of the rising input signal reaches the first actual threshold value $V_{1threshold}$, and when the voltage of the falling input signal reaches the second actual threshold value $V_{2threshold}$, i.e., at moments $t_1'$, $t_2'$, $t_3'$, $t_4'$, not at the desired moments $t_1$, $t_2$, $t_3$, $t_4$. Thus, the output signal shown in FIG. 2b will switch between "one" and "zero" with a delay or skew.

Figure 2C:
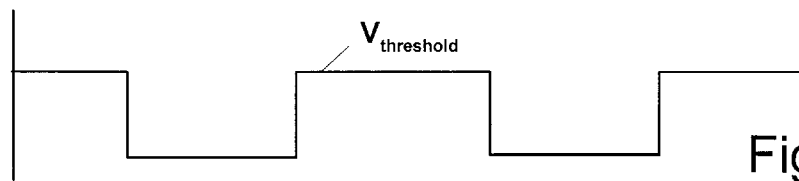
Figure 2D:
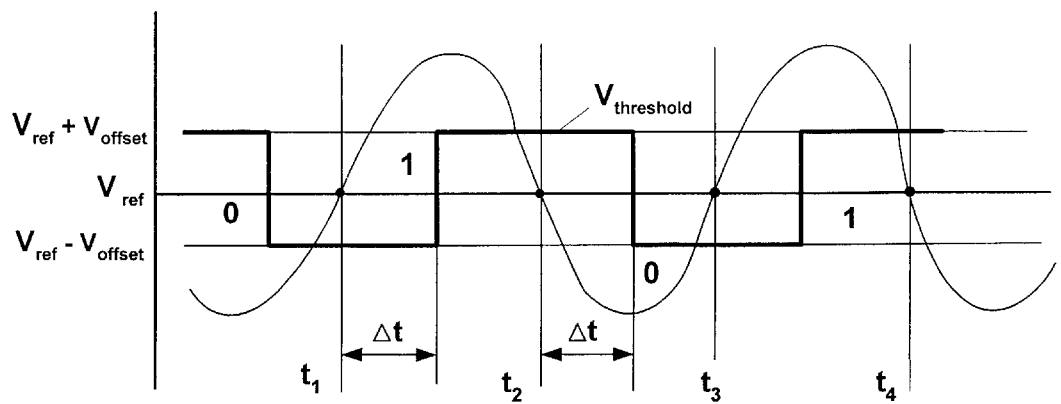

According to the invention, the reference signal is adjusted as illustrated in FIG. 2c. Thus, with the delay $\Delta t$ (of about half the period of the input signal) after the moment when the output signal has switched from "zero" to "one" at $t_1$, the reference voltage $V_{ref}$ is increased by $V_{offset}$, by means of the reference signal adjusting means 20. Therefore, actually, the next time the threshold signal is crossed, and the output signal switches from "one" and "zero" at the $t_2$, as desired. With the delay $\Delta t$ after $t_2$, the reference voltage $V_{ref}$ is decreased by $V_{offset}$, therefore, actually, the next time the threshold is crossed, and the output signal switches from "zero" to "one" at the moment $T_3$, as desired.

The delay $\Delta t$ is introduced to avoid switching the threshold at the same moment as the output signal is switched, which can cause receiver circuit oscillation.

It shall be appreciated that though the example embodiment has been described with reference to voltage levels, the invention may be as well implemented with respect to current levels. Thus, the described embodiments of the inventions are intended to be exemplary, and numerous variations and modifications will be apparent to those skilled in the art.

We claim:

1. A receiver, comprising:

a signal input which receives an input signal and a reference input which receives a reference signal;

a hysteretic comparator having a first input connected to the signal input, a second input connected to a threshold signal, and an output providing an output signal wherein the output signal defines a receiver output which varies between a high-level and a low-level; and a reference signal adjusting circuit having an adder/subtractor connected to the reference signal and to an offset signal, a circuit control input connected by feedback to said receiver output, and providing the threshold signal to the second input of the hysteretic comparator; the circuit being operative to increase the threshold signal when the output signal is at the high level, and to decrease the threshold signal when the output signal is at the low level.

2. A receiver according to claim 1, wherein the difference between the high and low levels defines a hysteresis value, wherein the adder/subtractor provides a sum output, and a difference output of said reference signal and offset signal;

and wherein the reference signal adjusting circuit further comprises:

an offset signal generator for producing said offset signal, the offset signal being substantially half the hysteresis value; and a multiplexor connected to said sum output and said difference output, the mutilplexor being connected to the circuit control input and providing the threshold signal to the second input of the hysteretic comparator.

3. A receiver according to claim 2, wherein a delay circuit is incorporated between the circuit control input and the multiplexor.

4. A receiver having an input which receives an input signal and a reference signal, and an output which produces an output digital signal varying from a high level to a low level depending on whether a threshold, that is a function of the reference signal, is crossed by the input signal, the receiver comprising:

a hysteretic comparator having a first input and a second input, and an output making up the receiver output and providing said output signal; wherein the output signal is high-level when the input signal is above a first threshold, and is low-level when the input signal is below a second threshold, the first threshold and the second threshold differing from one another by a hysteresis value, and a reference signal adjusting means comprising: a signal input, a control input to which said output signal is fed via a feedback line, an output for providing the threshold signal, an offset signal generator for producing an offset signal of substantially half the hysteresis value, an adder/subtractor having an input that makes up said adjusting means signal input, the adder/subtractor having another input for receiving said offset signal, and an output providing a sum and difference of these reference signal and offset signal, and a multiplexor having an input receiving said sum and difference, a control input that makes up said adjusting means control input and an output that makes up said adjusting means output; wherein the reference signal adjusting means increases the reference signal when the output signal is high-level, and decreases the reference signal when the output signal is low-level, and wherein said first comparator input and said adjusting means signal input make up said receiver input so that said input signal is fed to the first comparator input; said reference signal is fed to the adjusting means signal input; and said adjusting means output is connected to the comparator second input.

* * * * *

UNITED STATES PATENT AND TRADEMARK OFFICE
CERTIFICATE OF CORRECTION

PATENT NO. : 6,642,764 B2
DATED : November 4, 2003
INVENTOR(S) : Alexander Roger Deas et al.

It is certified that error appears in the above-identified patent and that said Letters Patent is hereby corrected as shown below:

<u>Title page,</u>
Item [73], Assignee, delete "Acuid Corporation (Guernsey) Limited, Guernsey (VG)" and substitute -- Acuid Corporation (Guernsey) Limited, Guernsey (Guernsey) --.

Signed and Sealed this

Thirtieth Day of March, 2004

JON W. DUDAS
*Acting Director of the United States Patent and Trademark Office*